(12) United States Patent
Yim

(10) Patent No.: US 9,870,821 B2
(45) Date of Patent: Jan. 16, 2018

(54) ELECTRONIC DEVICE

(71) Applicant: SK hynix Inc., Icheon-Si (KR)

(72) Inventor: Hyuck-Sang Yim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 199 days.

(21) Appl. No.: 14/588,292

(22) Filed: Dec. 31, 2014

(65) Prior Publication Data

US 2015/0287454 A1 Oct. 8, 2015

(30) Foreign Application Priority Data

Apr. 4, 2014 (KR) ........................ 10-2014-0040403

(51) Int. Cl.
*G11C 13/00* (2006.01)
*G06F 12/0802* (2016.01)
*G11C 7/22* (2006.01)
*G11C 11/16* (2006.01)

(52) U.S. Cl.
CPC ........ *G11C 13/004* (2013.01); *G06F 12/0802* (2013.01); *G11C 7/227* (2013.01); *G11C 11/1659* (2013.01); *G11C 11/1673* (2013.01); *G11C 13/0004* (2013.01); *G11C 13/0007* (2013.01); *G06F 2212/202* (2013.01); *G06F 2212/222* (2013.01); *G06F 2212/305* (2013.01); *G11C 2013/0054* (2013.01)

(58) Field of Classification Search
CPC .................................................... G11C 13/004
USPC ..................................................... 365/189.09
See application file for complete search history.

(56) References Cited

U.S. PATENT DOCUMENTS

| | | | |
|---|---|---|---|
| 2006/0044885 A1* | 3/2006 | Frulio | G11C 7/062 365/189.09 |
| 2006/0171227 A1* | 8/2006 | Lasseuguette | G11C 7/062 365/209 |
| 2011/0032746 A1* | 2/2011 | Maejima | G11C 11/16 365/148 |
| 2012/0147664 A1* | 6/2012 | Rho | G11C 11/15 365/158 |
| 2014/0022855 A1* | 1/2014 | Jang | G11C 17/16 365/189.07 |
| 2014/0241097 A1* | 8/2014 | Hawes | G11C 16/20 365/230.01 |
| 2015/0170726 A1* | 6/2015 | Antonyan | G11C 11/1673 365/158 |

FOREIGN PATENT DOCUMENTS

KR 10-2011-0095022 A 8/2011

* cited by examiner

*Primary Examiner* — Min a Huang
(74) *Attorney, Agent, or Firm* — Perkins Coie LLP

(57) ABSTRACT

An electronic device including a semiconductor memory is disclosed. The semiconductor memory includes a read path including a unit storage cell; a reference path including a unit reference cell; read circuit suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage.

18 Claims, 10 Drawing Sheets

ELECTRONIC DEVICE

CROSS-REFERENCE TO RELATED APPLICATIONS

This patent document claims priority and benefits of Korean Patent Application No. 10-2014-0040403, entitled "ELECTRONIC DEVICE" and filed on Apr. 4, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which data stored in a unit storage cell can be stably read.

In one aspect, an electronic device is provided to include a semiconductor memory that includes: a read path including a unit storage cell; a reference path including a unit reference cell; a read circuit suitable for comparing a read current flowing on the read path with a reference current flowing on the reference path to produce a comparison in response to a read voltage and a reference voltage, and for sensing data stored in the unit storage cell based on the comparison; a first replica path suitable for modeling the read path; and a reference voltage generation unit suitable for generating the reference voltage corresponding to a first replica current flowing on the first replica path in response to the read voltage.

In some implementations, the semiconductor memory may further comprise a second replica path modeling the reference path, and the reference voltage generation unit may generate a second replica current flowing on the second replica path by mirroring the first replica current, and generate the reference voltage corresponding to the generated second replica current. In some implementations, the first replica path may comprise: a high level replica path including the unit storage cell in which data of a logic high level is stored; and a low level replica path including the unit storage cell in which data of a logic low level is stored, and the reference voltage generation unit may generate the first replica current by averaging current flowing on the high level replica path and current flowing on the low level replica path. In some implementations, the unit storage cell may comprise a variable resistance element whose resistance varies in response to currents applied to both ends of the variable resistance element, and the variable resistance element may include at least one of metal oxide, a phase change substance or a structure in which a tunneling barrier layer is interposed between two ferromagnetic layers.

In another aspect, an electronic device is provided to include a semiconductor memory that includes: a read path coupled to a low voltage terminal, and including a unit storage cell; a reference path coupled to the low voltage terminal, and including a unit reference cell; a sensing unit coupled to a high voltage terminal, wherein the sensing unit is configured to compare a read current flowing on the read path with a reference current flowing on the reference path to produce a comparison, and sense data stored in the unit storage cell based on the comparison; a read current clamping unit coupled between the sensing unit and the read path, wherein the read current clamping unit is configured to clamp the read current in response to a read voltage; a reference current clamping unit coupled between the sensing unit and the reference path, the reference current clamping unit configured to clamp the reference current in response to a reference voltage; a first replica path coupled to the low voltage terminal, the first replica path configured to model the read path; a second replica path coupled to the low voltage terminal, the second replica path configured to model the reference path; a current mirroring unit coupled to the high voltage terminal, the current mirroring unit configured to generate a second replica current flowing on the second replica path by mirroring a first replica current flowing on the first replica path; a first replica current clamping unit coupled between the current mirroring unit and the first replica path, the first replica current clamping unit configured to clamp the first replica current in response to the read voltage; and a second replica current clamping unit between the current mirroring unit and the second replica path, the second replica current clamping unit configured to clamp the second replica current in response to the reference voltage. In some implementations, the reference current clamping unit and the second replica current clamping unit may have a common gate input configured to receive the reference voltage, and wherein the reference current clamping unit and the second replica current clamping unit in combination form a current mirror structure. In some implementations, the semiconductor memory may further comprise: a first current path providing unit coupled between the current mirroring unit and the first replica current clamping unit, for the first current path providing unit configured to selectively connect the current mirroring unit with the first replica current clamping unit in response to a first read enable signal; and a second current path providing unit coupled between the current mirroring unit and the second replica current clamping unit, the second current path providing unit configured to selectively connect the current mirroring unit with the second replica current clamping unit in response to the first read enable signal. In some implementations, the sensing unit is configured to operate in response to a second read enable signal, and an activation section of the second read enable signal may be included in an activation section of the first read enable signal. In some implementations, the first replica path may comprise: a high level replica path including a unit storage cell in which data of a logic high level is stored; and a low level replica path including a unit storage cell in which data of a logic low level is stored, and wherein the semiconductor memory comprises an equalizing unit configured to generate the first replica current by averaging current flowing on the high level replica path and current flowing on the low level replica path. In some implementations, the unit storage cell may comprise a variable resistance element whose resistance varies in response to currents applied to both ends of the variable resistance element, and the variable resistance element may include at least one of metal oxide, a phase change substance or a structure in which a tunneling barrier layer is interposed between two ferromagnetic layers.

In another aspect, an electronic device is provided to comprise a semiconductor memory device which includes: a read voltage generation block configured to generate a read voltage; a reference voltage generation block configured to generate a reference voltage; and a memory block including one or more read blocks in electrical communication with the read voltage generation block and the reference voltage generation block, each read block including: a unit storage cell, a unit reference cell, and read circuitry in electrical communication with the unit storage cell and the unit reference cell, the read circuitry configured to sense data stored in the unit storage cell in response to the read voltage applied to the unit storage cell and the reference voltage applied to the unit reference cell; wherein the reference voltage generation block includes replica circuitry configured to model the unit storage cell and the unit reference cell of a corresponding read block.

In some implementations, the replica circuitry comprises: a unit storage cell in which data of a logic high level is stored; and a unit storage cell in which data of a logic low level is stored. In some implementations, the read circuitry includes a current sensing unit to sense the data stored in the unit storage cell based on a read current flowing through the unit storage cell and a reference current flowing through the unit reference cell generated in response to the applied read voltage and reference voltage respectively. In some implementations, the unit storage cell includes a variable resistance element whose resistance varies in response to the read current flowing through the variable resistance element. In some implementations, the variable resistance element includes at least one of metal oxide, a phase change substance or a structure in which a tunneling barrier layer is interposed between two ferromagnetic layers.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a microprocessor which includes: a control unit that is configured to receive a signal including a command external to the microprocessor, and that performs extracting the command from the received signal, decoding of the extracted command, or controlling input and/or output of a signal to and from the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

These and other aspects, implementations and associated advantages are described in greater detail in the drawings, the description and the claims.

DETAILED DESCRIPTION

Figure 1:
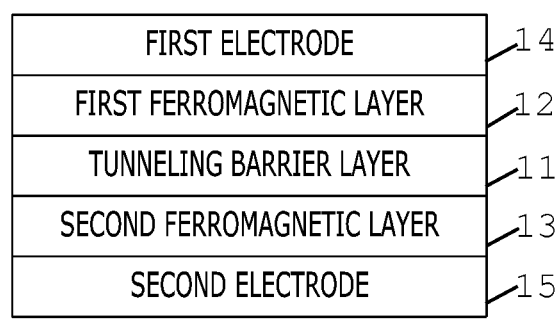
FIG. 1 is a diagram illustrating an implementation of a magnetic tunnel junction (MTJ) element including a tunneling barrier layer interposed between two ferromagnetic layers.

Various examples and implementations of the disclosed technology are described below in detail with reference to the accompanying drawings. In the following description, the gist of the present disclosure are unrelated to the known configurations may be omitted. In each drawing the components of the addition as the reference number, the same components shown on the drawing is concerned, even though other possible so as to have the same number should be noted A semiconductor device fabricated in accordance with various implementations of the present disclosure may include a variable resistance element. In the following descriptions, a variable resistance element may exhibit a variable resistance characteristic and may include a single layer or a multi-layer structure. Examples of substances found in a variable resistance element can include a chalcogenide-based compound, a transition metal compound, a ferroelectric, a ferromagnetic, and other materials. These substances can be used to construct variable resistance elements in various configurations, including, e.g., an RRAM, a PRAM, an MRAM, an FRAM, and other memory devices. However, the implementation of disclosed technology in the present disclosure is not limited to these substances, and it is sufficient for a variable resistance element to have a variable resistance characteristic that switches between different resistant states in response to voltages or currents applied.

In detail, a variable resistance element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a variable resistance element may exhibit a characteristic that switches between different resistant states due to creation and extinction of current filaments through behavior of vacancies.

Also, a variable resistance element may include a phase change substance. For example, the phase change substance may be a chalcogenide-based substance such as GST (Ge—Sb—Te) and other suitable materials. This variable resistance element having a phase change substance may exhibit a characteristic of switching between different resistant states by being stabilized in a crystalline state and an amorphous state in response to heat.

Further, a variable resistance element may include a structure in which a tunneling barrier layer is interposed between two ferromagnetic layers. The ferromagnetic layers may be formed using a substance such as NiFeCo, CoFe, and other suitable materials. The tunneling barrier layer may be formed using a substance such as $Al_2O_3$ and other suitable materials. The variable resistance element may exhibit a characteristic of switching between different resistant states according to magnetization directions of the ferromagnetic layers. For example, in the case where the magnetization directions of the two ferromagnetic layers are parallel to each other, the variable resistance element may be in a low resistant state, and, in the case where the magnetization directions of the two ferromagnetic layers are anti-parallel to each other, the variable resistance element may be in a high resistant state.

FIG. 1 is a diagram illustrating an implementation of a magnetic tunnel junction (MTJ) element 10 including a tunneling barrier layer 11 interposed between two ferromagnetic layers 12 and 13.

Referring to FIG. 1, the MTJ element 10 includes a first electrode layer 14 as a top electrode, a second electrode layer 15 as a bottom electrode, a first ferromagnetic layer 12 and a second ferromagnetic layer 13 as a pair of ferromagnetic layers, and a tunneling barrier layer 11 which is formed between the pair of the first and second ferromagnetic layers 12 and 13.

The first ferromagnetic layer 12 may be implemented as a free ferromagnetic layer having a magnetization direction changeable according to a direction of a current applied to the MTJ element 10. The second ferromagnetic layer 13 may be a pinned ferromagnetic layer having a magnetization direction that is pinned so as to not change in response to the current applied to the MTJ element.

The MTJ element 10 operates to store binary data values of either "0" or "1" as the resistance value is changed to a low value or high value, respectively, according to a direction of the current applied to the MTJ element 10.

Figure 2A:
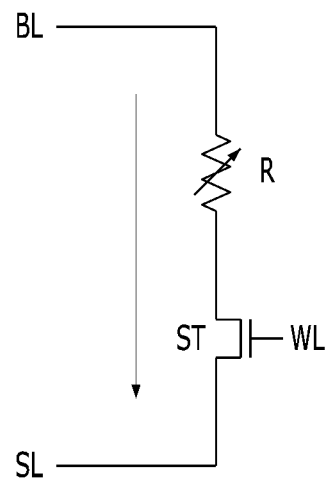
FIGS. 2A and 2B are diagrams explaining an exemplary operation for storing data in a variable resistance element.
Figure 2B:
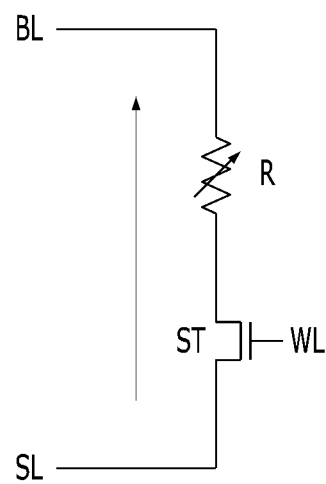

FIGS. 2A and 2B are diagrams explaining an exemplary principle of storing data in a variable resistance element R. In FIGS. 2A and 2B, the variable resistance element may be implemented using the MTJ element 10 described in FIG. 1.

FIG. 2A is a diagram explaining an exemplary operation for recording data of a low logic value in the variable resistance element R (16). In order to select the variable resistance element R (16) for storing data, a word line WL (17) coupled to the variable resistance element R (16) is activated to turn on a switching element, such as a transistor ST 18. As a current flows from one end to the other end (in the direction indicated by the arrow 19), that is, from the first electrode layer 14 as a top electrode to the second electrode layer 15 as a bottom electrode in the MTJ element 10 shown in FIG. 1, the magnetization direction of the first ferromagnetic layer 12 as a free ferromagnetic layer and the magnetization direction of the second ferromagnetic layer 13 as a pinned ferromagnetic layer become parallel to each other, and the variable resistance element R (16) is in a low resistant state. When the variable resistance element R (16) is in the low resistant state, it is defined that the 'low' data value is stored in the variable resistance element R (16).

FIG. 2B is a diagram explaining an exemplary principle of recording data of a high logic value in the variable resistance element R (16). In a manner similar to the exemplary principle described with respect to FIG. 2A, the word line WL 17 coupled to the variable resistance element R (16) is activated to turn on a switching element, such as the transistor ST 18. As a current flows from the other end to one end (in the direction indicated by the arrow 20), that is, from the second electrode layer 15 to the first electrode layer 14 in the MTJ element 10 shown in FIG. 1, the magnetization direction of the first ferromagnetic layer 14 and the magnetization direction of the second ferromagnetic layer 15 become anti-parallel to each other, and the variable resistance element R (16) is in a high resistant state. When the variable resistance element R (16) is in the high resistant state, it is defined that a 'high' data is stored in the variable resistance element R (16).

The logic value of the data stored in the variable resistance element R (16) is changed according to the resistance value of the variable resistance element R (16). In the case where there exists a large difference in the resistance values between the high resistant state and the low resistant state, it is easy to discriminate the data stored in the variable resistance element R (16) by discriminating the two different logic states with a high accuracy based on the two significantly different resistance values. In the case where there exists a small difference in the resistance values between the high resistant state and the low resistant state, it is difficult to discriminate the data stored in the variable resistance element R 16, because an error is more or highly likely to occur during the data determination when the two different resistance values are not significantly different from each other. Therefore, it would be beneficial to more precisely discriminate the data stored in a variable resistance element even when there exists a small difference in the resistance values between the high resistance state and the low resistance state of the variable resistance element R (16).

Figure 3:
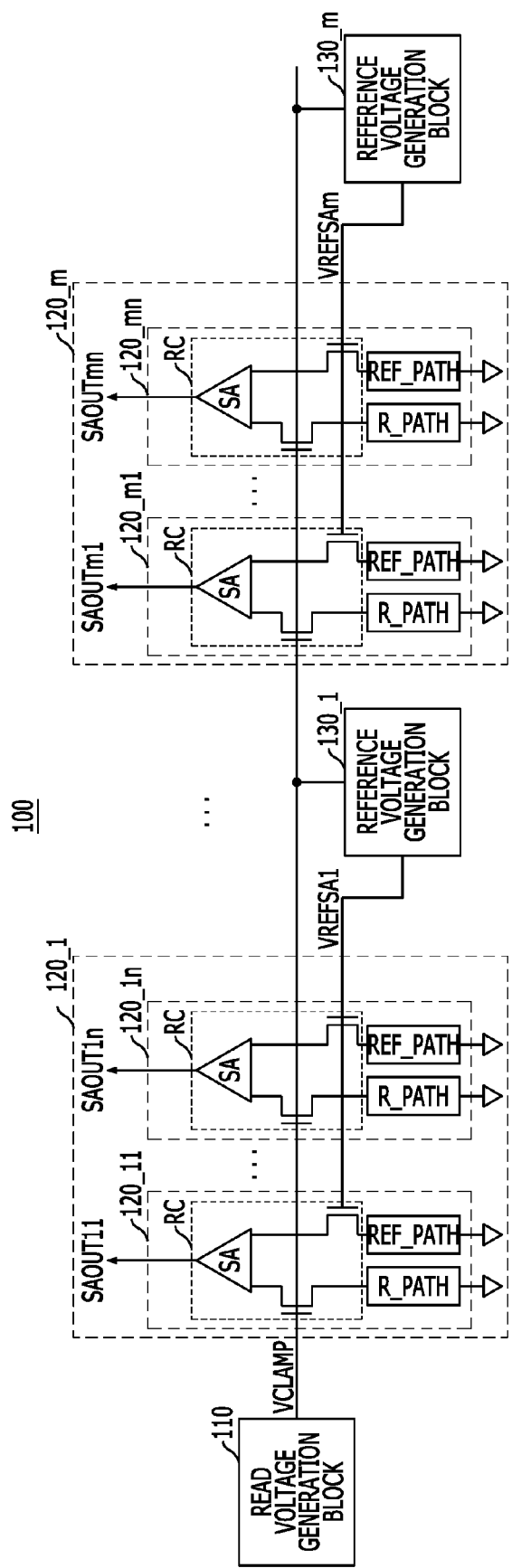
FIG. 3 is an exemplary configuration diagram of a memory circuit in accordance with an implementation of the disclosed technology in this patent document.

FIG. 3 is an exemplary configuration diagram of a memory circuit 100 in accordance with an implementation of this patent document. In FIG. 3, the memory circuit (or device) 100 shown can include the variable resistance element R 16 and the transistor ST 18, for example. For convenience of description only, FIG. 3 is shown and described for a configuration relating to a read operation.

Referring to FIG. 3, the memory circuit 100 may include a read voltage generation block 110, first to m-th memory blocks 120_1 to 120_m, and first to m-th reference voltage generation blocks 130_1 to 130_m. The read voltage generation block 110 generates a read voltage VCLAMP. The first to m-th memory blocks 120_1 to 120_m read previously stored data based on the read voltage VCLAMP and respective reference voltages VREFSA1 to VREFSAm during a read operation. The first to m-th reference voltage generation blocks 130_1 to 130_m generate the respective reference voltages VREFSA1 to VREFSAm corresponding to the first to m-th memory blocks 120_1 to 120_m in response to the read voltage VCLAMP during the read operation.

In some implementations, the read voltage generation block 110 may include a general voltage generator, and may continuously generate the read voltage VCLAMP at a constant level.

Each of the first to m-th memory blocks 120_1 to 120_m may be a unit memory region such as a bank, a mat and the like, or a local memory region including a part of the unit memory region. Each of the first to m-th memory blocks 120_1 to 120_m may include first to n-th read blocks 120_11 to 120_1n, . . . , and 120_m1 to 120_mn. Each of the first to n-th read blocks 120_11 to 120_1n, . . . , and 120_m1 to 120_mn may include a circuit for reading data. A detailed description for the first to n-th read blocks 120_11 to 120_1n, . . . , and 120_m1 to 120_mn will be explained later.

The first to m-th reference voltage generation blocks 130_1 to 130_m may generate the reference voltages VREFSA1 to VREFSAm on which a global variation generated in the first to m-th memory blocks 120_1 to 120_m is reflected, in response to the read voltage VCLAMP. Here, the global variation may include a systematic variation having a local characteristic which includes the unit memory region, the local memory region and the like. For example, the global variation may include an external factor including a noise occurring in the read voltage VCLAMP and the like, and an internal factor due to characteristic differences between internal elements. In particular, the internal factor may include a threshold voltage difference ΔVt between a read current clamping unit CLTR1 and a reference current clamping unit CLTR2, a resistance distribution ΔR of a unit storage cell, a margin ΔTMR between a high level and a low level of the unit storage cell, and the like. A detailed description for the first to m-th reference voltage generation blocks 130_1 to 130_m will be explained along with the first to n-th read blocks 120_11 to 120_1n, . . . , and 120_m1 to 120_mn later.

Meanwhile, since the first to n-th read blocks 120_11 to 120_1n, . . . , and 120_m1 to 120_mn have the same configuration with each other and the first to m-th reference voltage generation blocks 130_1 to 130_m have the same configuration with each other, the first read block 120_11 of the first memory block 120_1 and the first reference voltage generation block 130_1 will be described representatively.

Figure 4:
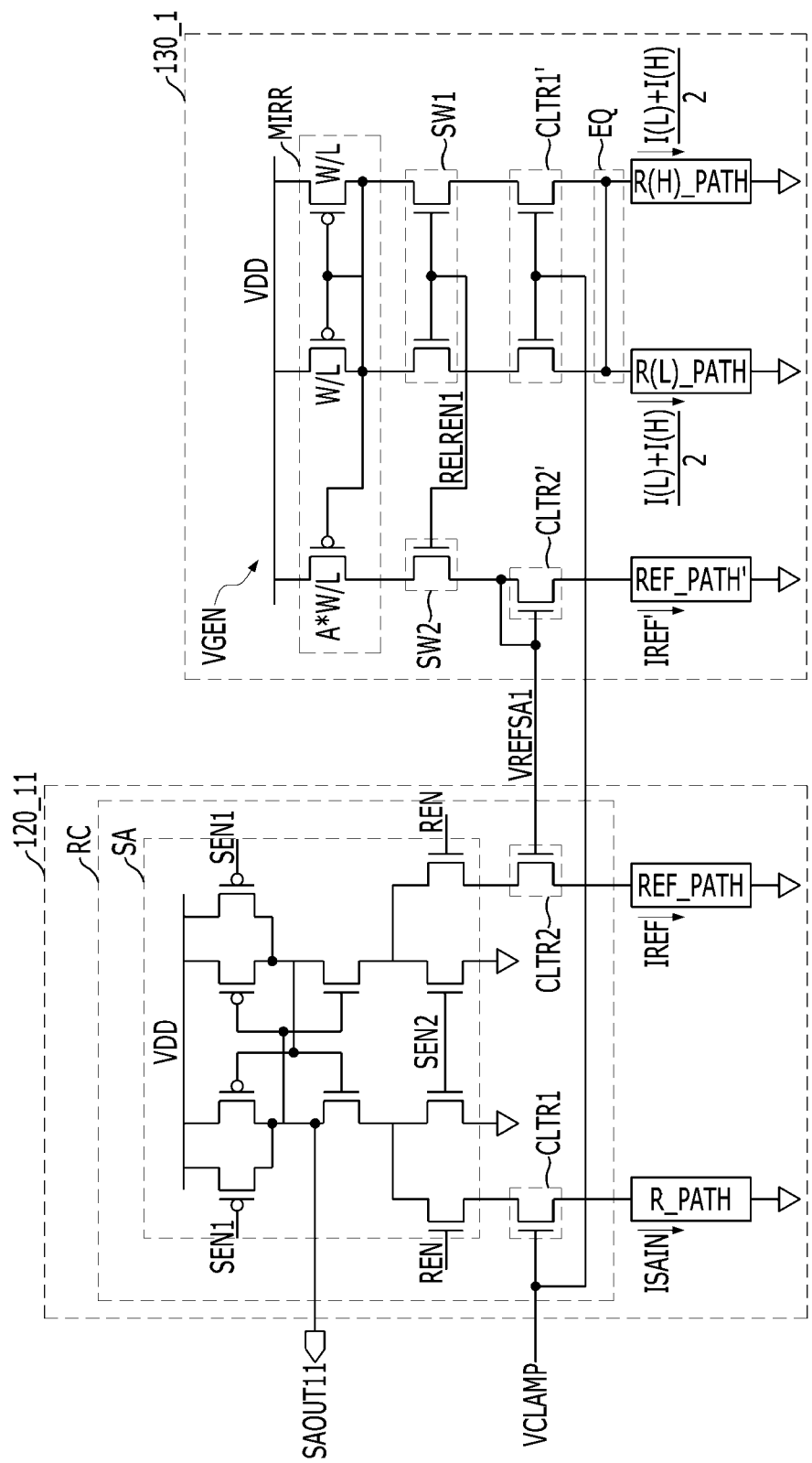
FIG. 4 shows an example of a configuration diagram of a first read block and a first reference voltage generation block shown in FIG. 3.

FIG. 4 shows an example of a configuration diagram of the first read block 120_11 and the first reference voltage generation block 130_1 shown in FIG. 3.

Referring to FIG. 4, the first read block 120_11 may include a read path R_PATH, a reference path REF_PATH and a read circuit RC. The read path R_PATH includes the unit storage cell (not shown) including the variable resistance element R 16 and the transistor ST 18 described in FIGS. 2A and 2B. The reference path REF_PATH includes a reference storage cell (not shown). The read circuit RC compares a read current ISAIN flowing on the read path R_PATH with a reference current IREF flowing on the reference path REF_PATH in response to the read voltage VCLAMP and the reference voltage VREFSA1, and senses data stored in the unit storage cell based on the comparison result.

Though not shown in FIG. 4, the read path R_PATH may include the unit storage cell, various switching elements coupled to the unit storage cell in series, a unit bit line and the like. The read path R_PATH may be coupled between the read circuit RC and a ground voltage (VSS) terminal.

The reference path REF_PATH may include elements for generating the read current ISAIN in case where a data of a logic high level is stored, and the reference current IREF corresponding to a half level of the read current ISAIN in case where a data of a logic low level is stored. For example, though not shown in FIG. 4, the reference path REF_PATH may include the reference storage cell, various switching elements coupled to the reference storage cell in series, a reference bit line and the like. Here, the reference storage cell, various switching elements, the reference bit line and the like may be implemented with a replica circuit. The reference path REF_PATH may be coupled between the read circuit RC and the ground voltage (VSS) terminal.

The read circuit RC may include a sensing unit SA, a read current clamping unit CLTR1, and a reference current clamping unit CLTR2. The sensing unit SA compares the read current ISAIN with the reference current IREF, and senses the data stored in the unit storage cell to output a sensing signal SAOUT11 based on the comparison result. The read current clamping unit CLTR1 clamps the read current ISAIN in response to the read voltage VCLAMP.

The reference current clamping unit CLTR2 clamps the reference current IREF in response to the reference voltage VREFSA1.

The sensing unit SA may operate in response to a first read enable signal REN, and include a typical comparator such as a sense amplifier. Since the comparator is well known, its detailed description will be omitted for conciseness.

The read current clamping unit CLTR1 may include an NMOS transistor coupled between one of two input terminals of the sensing unit SA and the read path R_PATH, and having a gate receiving the read voltage VCLAMP.

The reference current clamping unit CLTR2 may include an NMOS transistor coupled between the other of two input terminals of the sensing unit SA and the reference path REF_PATH, and having a gate receiving the reference voltage VREFSA1.

Meanwhile, the first reference voltage generation block 130_1 may include unit replica paths R(L)_PATH and R(H)_PATH modeling the read path R_PATH, a reference replica path REF_PATH' modeling the reference path REF_PATH, and a reference voltage generation unit VGEN. The reference voltage generation unit VGEN generates the reference voltage VREFSA1 based on a unit replica current (I(L)+I(H))/2 flowing through the unit replica paths R(L)_PATH and R(H)_PATH and a reference replica current IREF' flowing through the reference replica path REF_PATH' in response to the read voltage VCLAMP.

The unit replica paths R(L)_PATH and R(H)_PATH correspond to a high level replica path R(H)_PATH and a low level replica path R(L)_PATH, respectively. The high level replica path R(H)_PATH can include a unit storage cell (not shown) in which a data of a logic high level is stored, and the low level replica path R(L)_PATH can include a storage cell unit (not shown) in which a data of a logic low level is stored. In some implementations, the unit storage cell included in each of the high level replica path R(H)_PATH, the low level replica path R(L)_PATH and the read path R_PATH may share substantially the same circuitry. In some implementations, the storage cell unit in the R(H)_PATH and the R(L)_PATH may include the same replica circuitry modeling the unit storage cell included in the read path R_PATH. The unit replica paths R(L)_PATH and R(H)_PATH are coupled between the reference voltage generation unit VGEN and the ground voltage (VSS) terminal.

The reference replica path REF_PATH' may be implemented with similar circuitry as internal circuitry of the reference path REF_PATH. Accordingly, when the reference current IREF is generated by mirroring the reference replica current IREF', a mismatch between the reference current IREF and the reference replica current IREF' may be minimized.

The reference voltage generation unit VGEN may include an equalizing unit EQ, a unit replica current clamping unit CLTR1', a current mirroring unit MIRR, a first current path providing unit SW1, a reference replica current clamping unit CLTR2', and a second current path providing unit SW2. The equalizing unit EQ generates the unit replica current (I(L)+I(H))/2 by averaging current I(H) flowing on the high level replica path R(H)_PATH and current I(L) flowing on the low level replica path R(L)_PATH. The unit replica current clamping unit CLTR1' clamps the unit replica current (I(L)+I(H))/2 in response to the read voltage VCLAMP. The current mirroring unit MIRR generates the reference replica current IREF' flowing on the reference replica path REF_PATH' by mirroring the unit replica current (I(L)+I(H))/2. The first current path providing unit SW1 selectively couples the current mirroring unit MIRR to the unit replica current clamping unit CLTR1' in response to a second read enable signal RELREN1. The reference replica current clamping unit CLTR2' clamps the reference replica current IREF' in response to the reference voltage VREFSA1. The second current path providing unit SW2 selectively couples the current mirroring unit MIRR to the reference replica current clamping unit CLTR2' in response to the second read enable signal RELREN1.

In detail, the equalizing unit EQ may have a common node structure in which one terminal of the high level replica path R(H)_PATH is coupled to one terminal of the low level replica path R(L)_PATH. That is, the equalizing unit EQ equalizes one terminal of the high level replica path R(H)_PATH with one terminal of the low level replica path R(L)_PATH.

The unit replica current clamping unit CLTR1' may include a first NMOS transistor and a second NMOS transistor. The first NMOS transistor is coupled between one terminal of the high level replica path R(H)_PATH and the first current path providing unit SW1, and has a gate receiving the read voltage VCLAMP. The second NMOS transistor is coupled between one terminal of the low level replica path R(L)_PATH and the first current path providing unit SW1, and has a gate receiving the read voltage VCLAMP.

The first current path providing unit SW1 may include a first NMOS transistor and a second NMOS transistor. The first NMOS transistor is coupled between the first NMOS transistor of the unit replica current clamping unit CLTR1' and the current mirroring unit MIRR, and has a gate receiving the second read enable signal RELREN1. The second NMOS transistor is coupled between the second NMOS transistor of the unit replica current clamping unit CLTR1' and the current mirroring unit MIRR, and has a gate receiving the second read enable signal RELREN1. Here, an activation section of the second read enable signal RELREN1 may include an activation section of the first read enable signal REN. That is, the second read enable signal RELREN1 may be activated before the first read enable signal REN is activated. In this case, the first reference voltage generation block 130_1 may generate the reference voltage VREFSA1 before the sensing unit SA operates, during the read operation. Accordingly, the reliability of the read operation may be enhanced.

The current mirroring unit MIRR may include a first PMOS transistor, a second PMOS transistor and a third PMOS transistor. The first PMOS transistor is coupled between a supply voltage (VDD) terminal and the first NMOS transistor of the first current path providing unit SW1, and has a gate electrically coupled to its drain. The second PMOS transistor is coupled between the supply voltage (VDD) terminal and the second NMOS transistor of the first current path providing unit SW1, and has a gate electrically coupled to its drain. The third PMOS transistor is coupled between the supply voltage (VDD) terminal and the second current path providing unit SW2, and has a gate electrically coupled to the drain of the second PMOS transistor. For the MIRR, the relationship between the size W/L (i.e., a ratio of width to length) of each of the first and second transistors and the size of the third transistor can be determined based on the expression A*W/L. When the size of the first and second transistors in the MIRR is substantially identical to the size of the third transistor, the variable A equals 1. While the size W/L of the first transistor may be substantially identical to the second transistor if the size of the third transistor is different from the size W/L of the first and second transistors, the variable A does not equal 1.

Accordingly, in case where a level of the replica current (I(L)+I(H))/2 does not reach a desired target threshold level, it is possible to compensate a target level of the reference replica current IREF' by adjusting the size of the third transistor. Moreover, the relationship between the level of the replica current (I(L)+I(H))/2 and the level of the reference replica current IREF' can be affected based at least in part on the mismatch in the size W/L of the first and second transistors with respect to the size A*W/L of the third transistor. For example, the level of the replica current (I(L)+I(H))/2 is substantially identical to the level of the reference replica current IREF' when the size W/L of the first and second transistors is substantially identical to the size A*W/L of the third transistor (where A=1). The level of the replica current (I(L)+I(H))/2 is different from the level of the reference replica current IREF' when the size W/L of the first and second transistors is identical to each but different from the size A*W/L of the third transistor (where A≠1).

The second current path providing unit SW2 may include an NMOS transistor which is coupled between the reference replica current clamping unit CLTR2' and the third NMOS transistor of the current mirroring unit MIRR. In addition, the NMOS transistor in the second current path providing unit has a gate receiving the second read enable signal RELREN1.

The reference replica current clamping unit CLTR2' may include an NMOS transistor which is coupled between one terminal of the reference replica path REF_PATH and the second current path providing unit SW2. In addition, the NMOS transistor in the reference replica current clamping unit CLTR2' has a gate electrically coupled to its drain. The reference voltage VREFSA1 is biased into the gate of the NMOS transistor included in the reference replica current clamping unit CLTR2'. Accordingly, since the reference replica current clamping unit CLTR2' and the reference current clamping unit CLTR2 have a common gate input receiving the reference voltage VREFSA1, the reference replica current clamping unit CLTR2' and the reference current clamping unit CLTR2 may form a current mirror structure.

For reference, the first reference voltage generation block 130_1 is described to generate the reference voltage VREFSA1 on which the global variation of the first read block 120_11 is reflected. As described above, since the global variation has the local characteristic, if the first reference voltage generation block 130_1 generates the reference voltage VREFSA1 by representatively modeling any of the first to n-th read blocks 120_11 to 120_1n included in the first memory block 120_1, e.g., the first read block 120_11, the global variation of the other read blocks, i.e., the second to n-th read blocks 120_12 to 120_1n, may be reflected on the reference voltage VREFSA1. Although the description has been made of the read block and the reference voltage generation block provided with a ratio of n to 1, the implementation of this patent document is not limited to this structure. In some implementations, the read block and the reference voltage generation block may be provided with a ratio of 1 to 1, for example.

Figure 5:
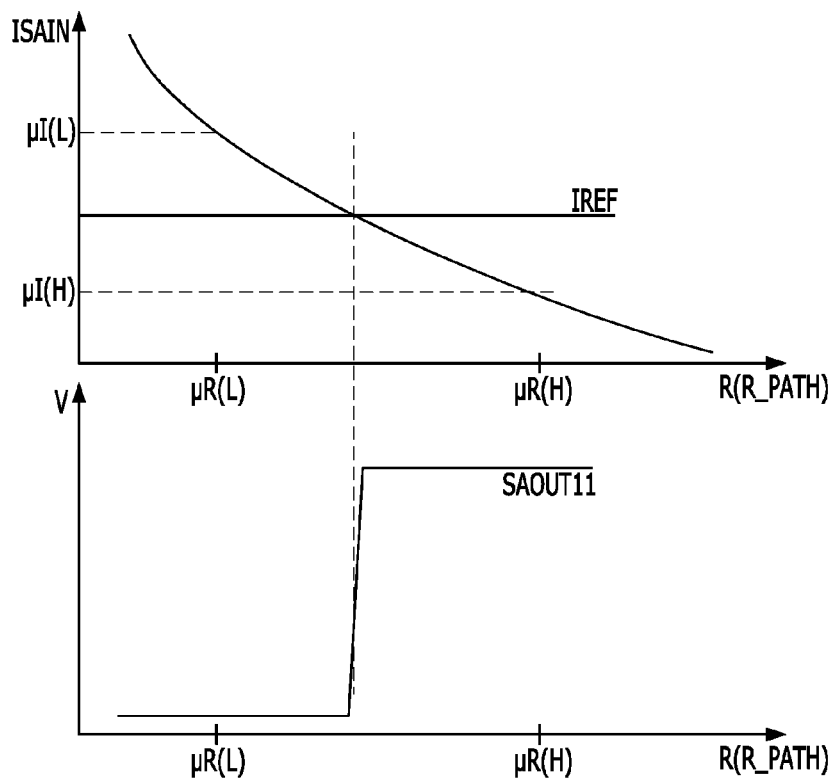
FIGS. 5, 6 and 7 are exemplary diagrams for explaining an operation of a memory circuit in accordance with an implementation of the disclosed technology in this patent document.
Figure 6:
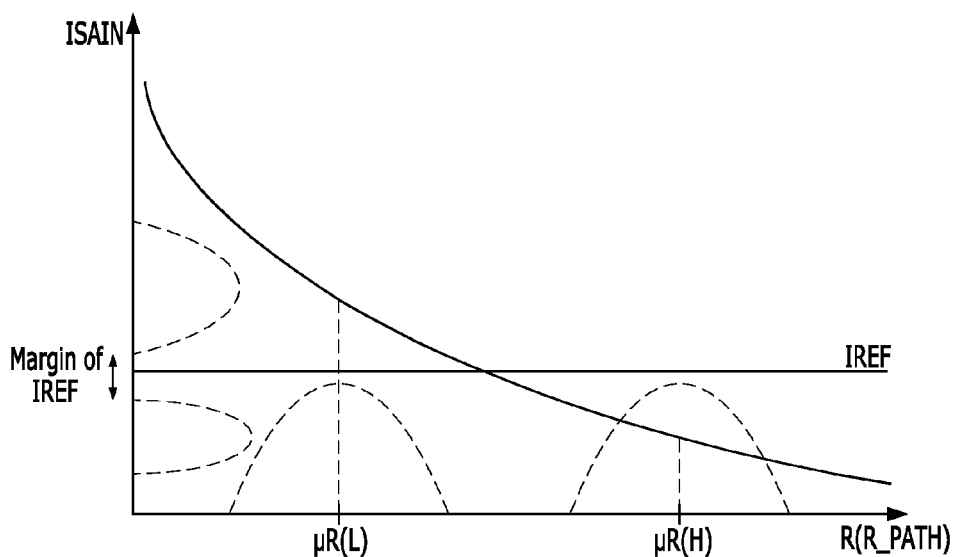
Figure 7:
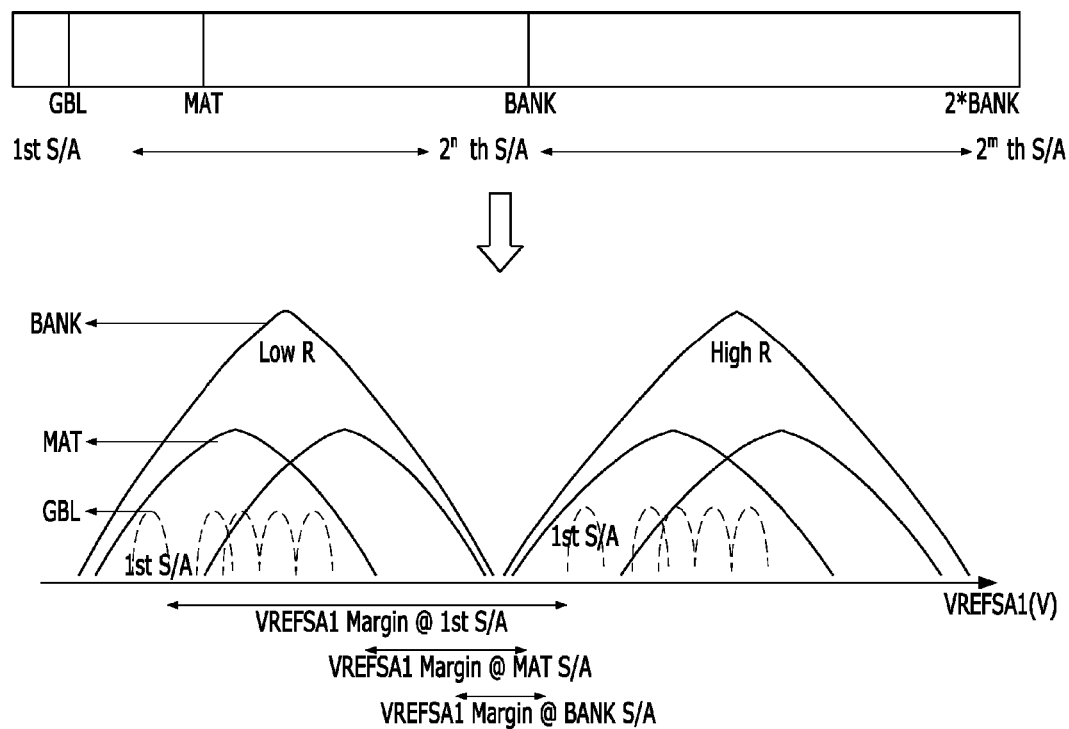

Hereinafter, an operation of the memory circuitry 100 will be described with reference to FIGS. 5, 6 and 7. In FIGS. 5, 6 and 7, the operation of the memory circuitry 100 relating to the first read block 120_11 and the first reference voltage generation block 130_1 will be described representatively.

FIG. 5 illustrates an operation of the first read block 120_11, and FIG. 6 illustrates a relationship between the read current ISAIN and the reference current IREF.

During a read operation, the first read block 120_11 compares the read current ISAIN flowing on the read path R_PATH with the reference current IREF flowing on the reference path REF_PATH in response to the read voltage VCLAMP and the reference voltage VREFSA1, and reads data previously stored in the read path R_PATH based on the comparison result. In more detail, the sensing unit SA operates in response to the first read enable signal REN, and compares the read current ISAIN clamped by the read current clamping unit CLTR1 with the reference current IREF clamped by the reference current clamping unit CLTR2 to output the data previously stored in the read path R_PATH as the sensing signal SAOUT11 based on the comparison result. For example, referring to FIG. 5, the sensing unit SA outputs the sensing signal SAOUT11 having a logic low level in case where the read current ISAIN is greater than the reference current IREF after comparing the read current ISAIN with the reference current IREF, and outputs the sensing signal SAOUT11 having a logic high level in case where the read current ISAIN is smaller than the reference current IREF.

Meanwhile, the read voltage VCLAMP is generated by the read voltage generation block 110 at a constant level. On the other hand, the reference voltage VREFSA1 is generated by the first reference voltage generation block 130_1 at a variable level. That is, the first reference voltage generation block 130_1 has an auto-adaptive characteristic for adjusting the reference voltage VREFSA1 according to the global variation generated in the first read block 120_11. Hereinbelow, a process for generating the reference voltage VREFSA1 will be explained in detail.

The unit replica current clamping unit CLTR1' clamps the unit replica current (I(L)+I(H))/2 flowing on the unit replica path R(L)_PATH and R(H)_PATH in response to the read voltage VCLAMP under the condition that the first current path providing unit SW1 forms a current path between the current mirroring unit MIRR and the replica current clamping unit CLTR1' in response to the second read enable signal RELREN1. At this time, the global variation of the read current clamping unit CLTR1 and the read path R_PATH is reflected on the unit replica current (I(L)+I(H))/2. This is because the unit replica current clamping unit CLTR1' and the unit replica path R(L)_PATH and R(H)_PATH, which model the read current clamping unit CLTR1 and the read path R_PATH, affect the replica current (I(L)+I(H))/2.

In addition, the current mirroring unit MIRR generates the reference replica current IREF' by mirroring the unit replica current (I(L)+I(H))/2 under the condition that the second current path providing unit SW2 forms a current path between the current mirroring unit MIRR and the reference replica current clamping unit CLTR2' in response to the second read enable signal RELREN1.

The reference replica current clamping unit CLTR2' generates the reference voltage VREFSA1 corresponding to the reference replica current IREF'. Since the reference replica current clamping unit CLTR2' and the reference current clamping unit CLTR2 form a current mirror structure, the reference current IREF which mirrors the reference replica current IREF' is generated. Referring to FIG. 6, a level distribution of the read current ISAIN flowing on the read path R_PATH is determined by a distribution of resistance R of the read path R_PATH. Even if the distribution of resistance R of the read path R_PATH varies due to the global variation, the level of the reference current IREF may be adaptively compensated.

FIG. 7 illustrates a margin of the reference voltage VREFSA for each memory region.

Referring to FIG. 7, a margin between a distribution of the reference voltage VREFSA1 corresponding to a low resistance state 'LOW R' and a distribution of the reference voltage VREFSA1 corresponding to a high resistance state 'HIGH R' is small in case of an upper region, i.e., a bank, of the first to m-th memory blocks 120_1 to 120_m. Further, a margin between a distribution of the reference voltage VREFSA1 corresponding to a low resistance state 'LOW R' and a distribution of the reference voltage VREFSA1 corresponding to a high resistance state 'HIGH R' is large in case of a lower region, i.e., a mat, of the first to m-th memory blocks 120_1 to 120_m. Accordingly, a range of the memory region may be determined in consideration of the local characteristic according to a device characteristic and the like.

In accordance with the above-described implementations, the electronic device may improve a read margin of the sensing unit SA according to the global variation by adjusting the reference voltage VREFSA1 or the reference current IREF based on the global variation generated in the read path R_PATH and the like.

Furthermore, in accordance with one or more of the above-described implementations, the electronic device may maintain the read margin of the sensing unit SA regardless of the global variation.

The above and other memory circuitry or semiconductor devices based on the disclosed technology can be used in a range of devices or systems. FIGS. 8-12 provide some examples of devices or systems that can implement the memory circuitry disclosed herein.

Figure 8:
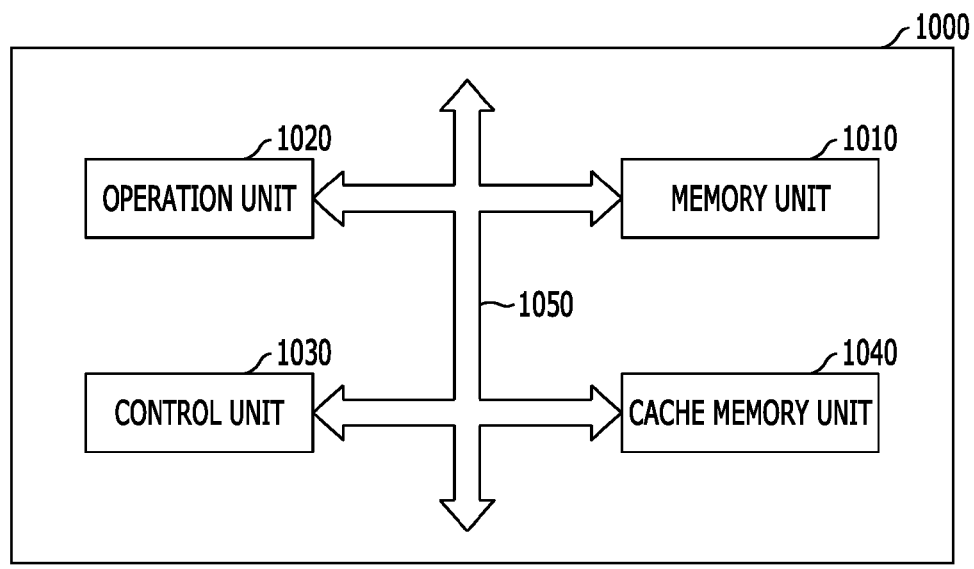
FIG. 8 shows an example of a configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a read path including a unit storage cell; a reference path including a unit reference cell; a read circuit suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage. Through this, a read margin of the memory unit 1010 may be improved, thereby improving the durability of the memory unit 1010 in case that the transistor is coupled to a memory element, for example, a resistance variable element. As a consequence, a fabrication process of the microprocessor 1000 may become easy and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from one or more of the memory unit 1010, the operation unit 1020 and an external device of the microprocessor 1000. The control unit 1030 can perform extraction of commands from received the signals, decode the extracted commands, control input and output of signals to and from the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
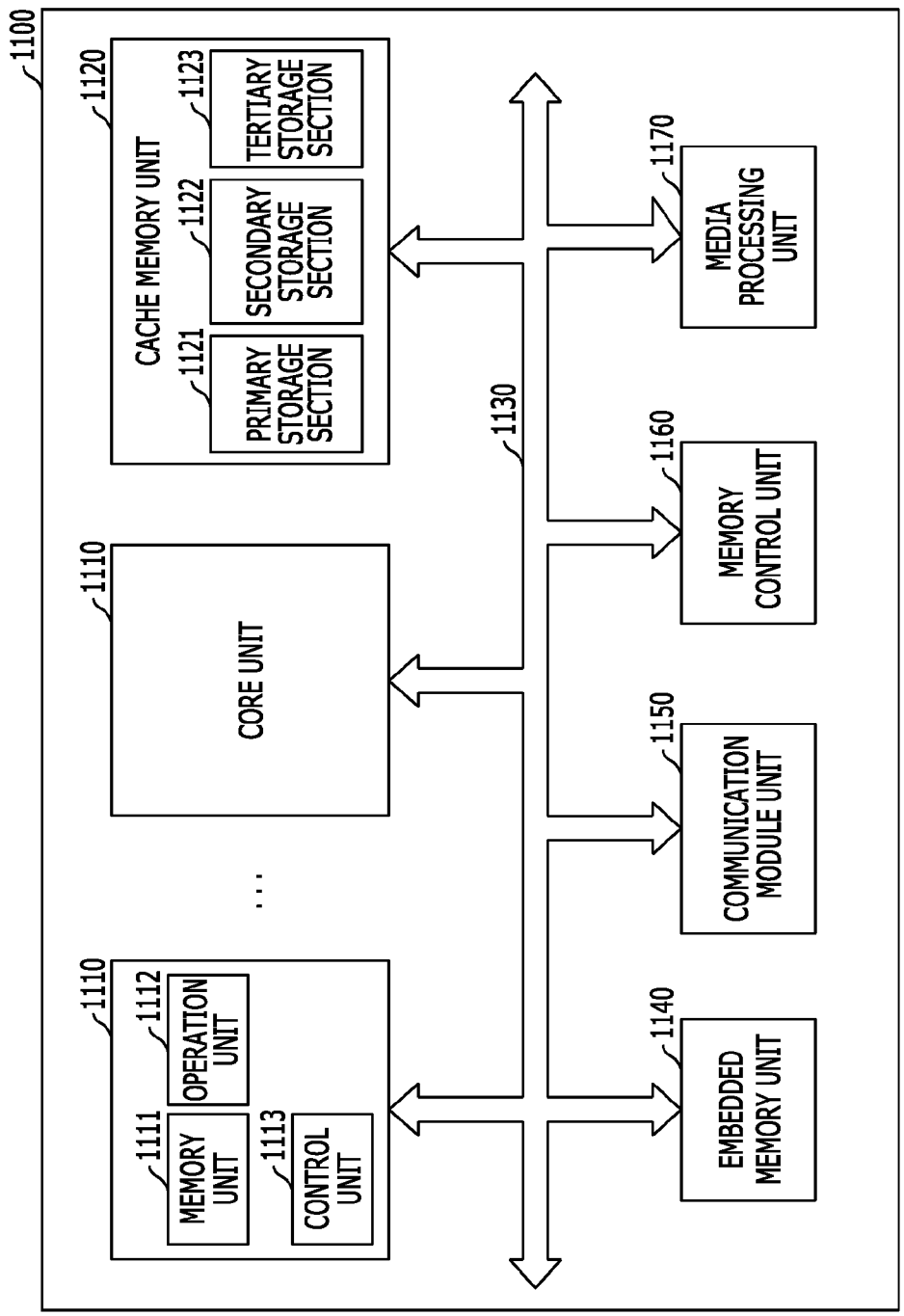
FIG. 9 shows an example of a configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a read path including a unit storage cell; a reference path including a unit reference cell; a read circuit suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage. Through this, a read margin of the cache memory unit 1120 may be improved, thereby improving the durability of the cache memory unit 1120 in case that the transistor is coupled to a memory element, for example, a resistance variable element. As a consequence, a fabrication process of the processor 1100 may become easy and performance characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
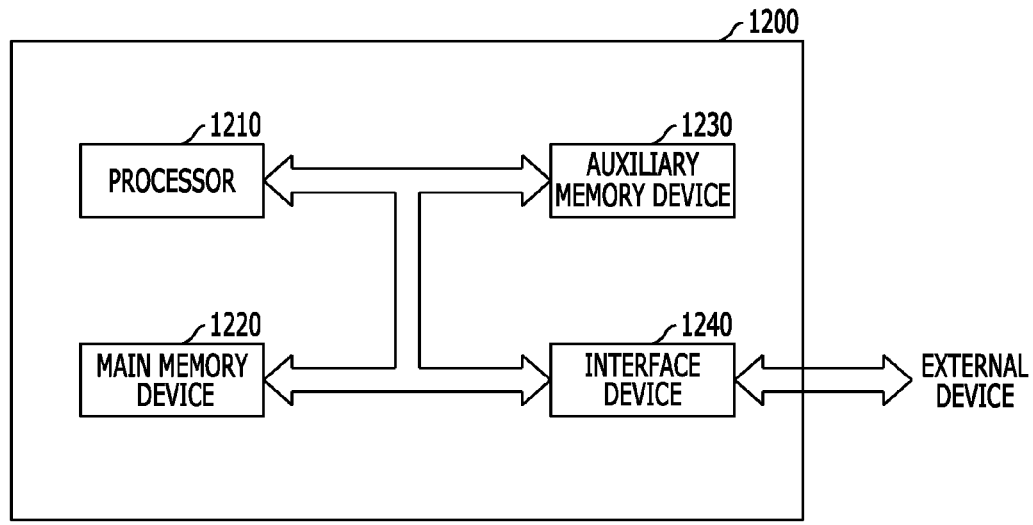
FIG. 10 shows an example of a configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a read path including a unit storage cell; a reference path including a unit reference cell; a read circuit suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage. Through this, a read margin of the main memory device 1220 may be improved, thereby improving the durability of the main memory device 1220 in case that the transistor is coupled to a memory element, for example, a resistance variable element. As a consequence, a fabrication process of the system 1200 may become easy and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a read path including a unit storage cell; a reference path including a unit reference cell; a read circuit suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage. Through this, a read margin of the auxiliary memory device 1230 may be improved, thereby improving the durability of the auxiliary memory device 1230 in case that the transistor is coupled to a memory element, for example, a resistance variable element. As a consequence, a fabrication process of the system 1200 may become easy and performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
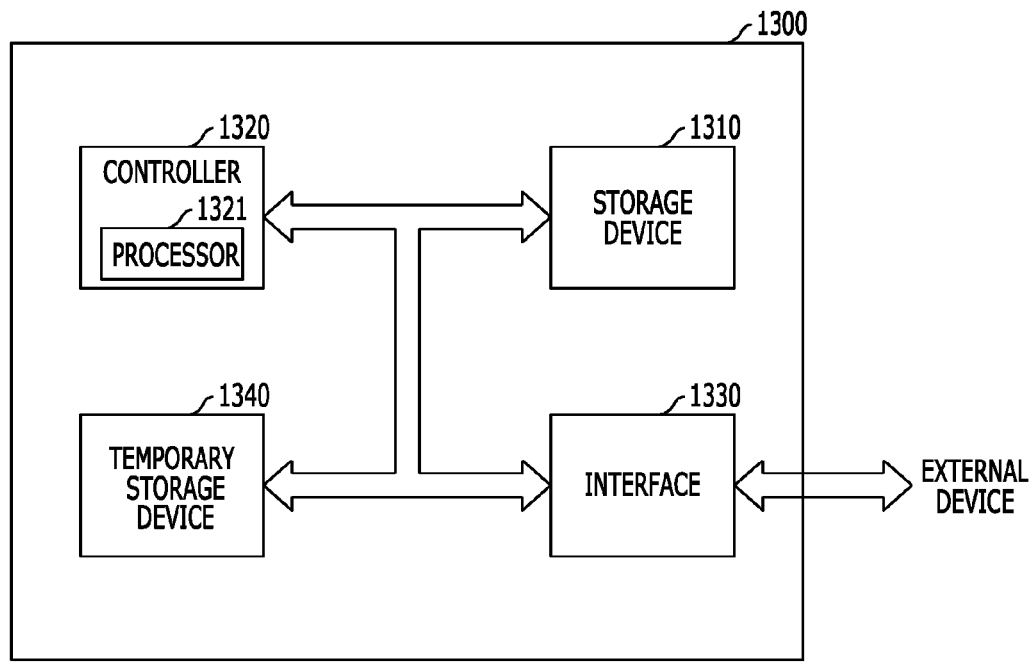
FIG. 11 shows an example of a configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with one or more of the disclosed implementations. For example, The temporary storage device 1340 may include a read path including a storage cell unit; a reference path including a reference cell unit; read circuitry suitable for comparing a read current flowing on the read path with a reference current flowing on the reference path in response to a read voltage and a reference voltage, and sensing data stored in the storage cell unit based on the comparison result; a first replica path suitable for modeling the read path; and a reference voltage generation unit suitable for generating the reference voltage corresponding to a first replica current flowing on the first replica path in response to the read voltage. Through this, a read margin of the temporary storage device 1340 may be improved, thereby improving the durability of the temporary storage device 1340 in case that the transistor is coupled to a memory element, for example, a resistance variable element. As a consequence, a fabrication process of the system 1200 may become easy and performance characteristics of the data storage system 1300 may be improved.

Figure 12:
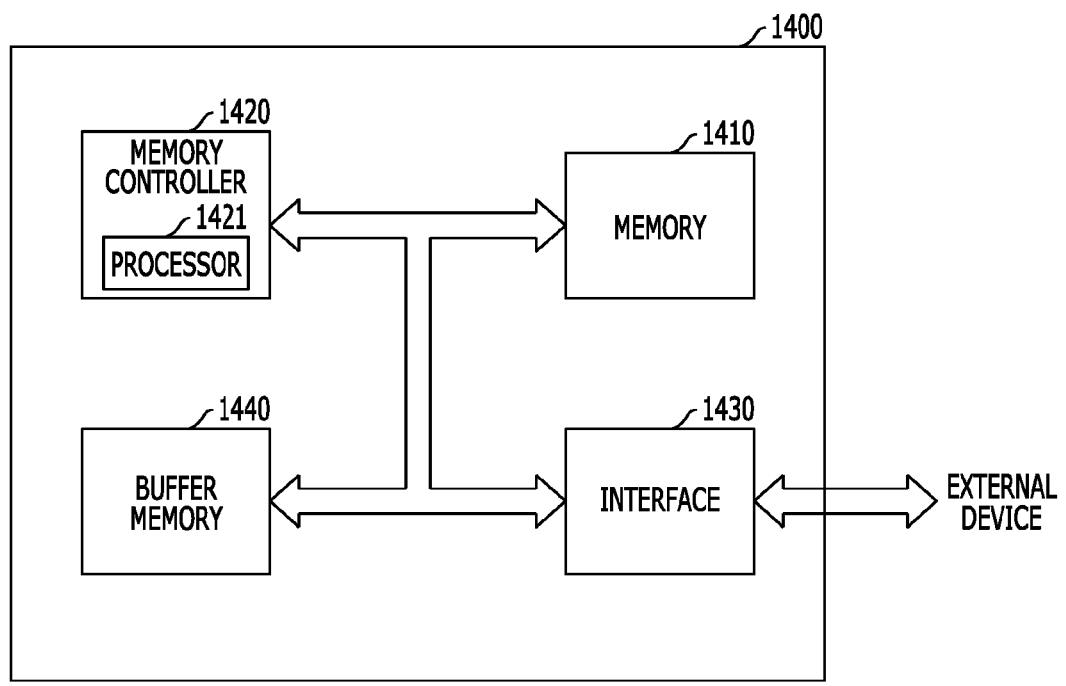
FIG. 12 shows an example of a configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with one or more of the disclosed implementations. For example, the memory 1410 may include a read path including a unit storage cell; a reference path including a unit reference cell; read circuitry suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage. Through this, a read margin of the memory 1410 may be improved, thereby improving the durability of the memory 1410 in case that the transistor is coupled to a memory element, for example, a resistance variable element. As a consequence, a fabrication process of the system 1200 may become easy and performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a read path including a unit storage cell; a reference path including a unit reference cell; read circuitry suitable for comparing a read current flowing on the read path with a reference current flowing on the reference path in response to a read voltage and a reference voltage, and sensing data stored in the unit storage cell based on the comparison result; a first replica path suitable for modeling the read path; and a reference voltage generation unit suitable for generating the reference voltage corresponding to a first replica current flowing on the first replica path in response to the read voltage. Through this, a read margin of the buffer memory 1440 may be improved, thereby improving the durability of the buffer memory 1440 in case that the transistor is coupled to a memory element, for example, a resistance variable element. As a consequence, a fabrication process of the system 1200 may become easy and performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document. While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An electronic device comprising a semiconductor memory, wherein the semiconductor memory comprises:
a read path including a unit storage cell;
a reference path including a unit reference cell;
a read circuit suitable for comparing a read current flowing on the read path with a reference current flowing on the reference path to produce a comparison in response to a read voltage and a reference voltage, and for sensing data stored in the unit storage cell based on the comparison;
a first replica path suitable for modeling the read path; and
a reference voltage generation unit suitable for generating the reference voltage corresponding to a first replica current flowing on the first replica path in response to the read voltage,
wherein the semiconductor memory further comprises a second replica path modeling the reference path, and
wherein the reference voltage generation unit generates a second replica current flowing on the second replica path by mirroring the first replica current, and generates the reference voltage corresponding to the generated second replica current.

2. The electronic device according to claim 1, wherein the first replica path comprises:
a high level replica path including the unit storage cell in which data of a logic high level is stored; and
a low level replica path including the unit storage cell in which data of a logic low level is stored, and
wherein the reference voltage generation unit generates the first replica current by averaging current flowing on the high level replica path and current flowing on the low level replica path.

3. The electronic device according to claim 1, wherein the unit storage cell comprises a variable resistance element whose resistance varies in response to currents applied to both ends of the variable resistance element, and the variable resistance element includes at least one of metal oxide, a phase change substance or a structure in which a tunneling barrier layer is interposed between two ferromagnetic layers.

4. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is part of the cache memory unit in the processor.

5. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit is part of the auxiliary memory device or the main memory device in the processing system.

6. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is part of the storage device or the temporary storage device in the data storage system.

7. An electronic device comprising a semiconductor memory, wherein the semiconductor memory comprises:
a read path coupled to a low voltage terminal, and including a unit storage cell;
a reference path coupled to the low voltage terminal, and including a unit reference cell;
a sensing unit coupled to a high voltage terminal, wherein the sensing unit is configured to compare a read current flowing on the read path with a reference current flowing on the reference path to produce a comparison, and sense data stored in the unit storage cell based on the comparison;
a read current clamping unit coupled between the sensing unit and the read path, wherein the read current clamping unit is configured to clamp the read current in response to a read voltage;
a reference current clamping unit coupled between the sensing unit and the reference path, the reference current clamping unit configured to clamp the reference current in response to a reference voltage;
a first replica path coupled to the low voltage terminal, the first replica path configured to model the read path;
a second replica path coupled to the low voltage terminal, the second replica path configured to model the reference path;
a current mirroring unit coupled to the high voltage terminal, the current mirroring unit configured to generate a second replica current flowing on the second replica path by mirroring a first replica current flowing on the first replica path;
a first replica current clamping unit coupled between the current mirroring unit and the first replica path, the first replica current clamping unit configured to clamp the first replica current in response to the read voltage; and
a second replica current clamping unit between the current mirroring unit and the second replica path, the second replica current clamping unit configured to clamp the second replica current in response to the reference voltage.

8. The electronic device according to claim 7, wherein the reference current clamping unit and the second replica current clamping unit have a common gate input configured to receive the reference voltage, and wherein the reference current clamping unit and the second replica current clamping unit in combination form a current mirror structure.

9. The electronic device according to claim 7, wherein the semiconductor memory further comprises:
a first current path providing unit coupled between the current mirroring unit and the first replica current clamping unit, the first current path providing unit configured to selectively connect the current mirroring unit with the first replica current clamping unit in response to a first read enable signal; and
a second current path providing unit coupled between the current mirroring unit and the second replica current clamping unit, the second current path providing unit configured to selectively connect the current mirroring unit with the second replica current clamping unit in response to the first read enable signal.

10. The electronic device according to claim 9, wherein the sensing unit is configured to operate in response to a second read enable signal, and an activation section of the second read enable signal is included in an activation section of the first read enable signal.

11. The electronic device according to claim 7, wherein the first replica path comprises:
a high level replica path including a unit storage cell in which a data of a logic high level is stored; and
a low level replica path including a unit storage cell in which a data of a logic low level is stored, and
wherein the semiconductor memory comprises an equalizing unit configured to generate the first replica current by averaging current flowing on the high level replica path and current flowing on the low level replica path.

12. The electronic device according to claim 7, wherein the unit storage cell comprises a variable resistance element whose resistance varies in response to currents applied to both ends of the variable resistance element, and the variable resistance element includes at least one of metal oxide, a phase change substance or a structure in which a tunneling barrier layer is interposed between two ferromagnetic layers.

13. The electronic device according to claim 7, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is part of the cache memory unit in the processor.

14. The electronic device according to claim 7, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is part of the storage device or the temporary storage device in the data storage system.

15. An electronic device comprising a semiconductor memory device which includes:
a read voltage generation block configured to generate a read voltage;
a reference voltage generation block configured to generate, in response to the read voltage, a reference voltage corresponding to a first replica current flowing on a first replica path including a high level replica path and a low level replica path; and
a memory block including one or more read blocks in electrical communication with the read voltage generation block and the reference voltage generation block, each read block including:
a unit storage cell,
a unit reference cell, and
read circuitry in electrical communication with the unit storage cell and the unit reference cell, the read circuitry configured to sense data stored in the unit storage cell in response to the read voltage applied to the unit storage cell and the reference voltage applied to the unit reference cell;
wherein the reference voltage generation block includes a first replica path suitable for modeling a read path including the unit storage cell and a second replica path modeling the reference path including the unit reference cell of a corresponding read block,
wherein the reference voltage generation block generates a second replica current flowing on the second replica path by mirroring the first replica current, and generates the reference voltage corresponding to the generated second replica current, and
wherein the reference voltage generation block generates the first replica current by averaging a first current flowing on the high level replica path including the unit storage cell in which data of a logic high level is stored and a second current flowing on the low level replica path including the unit storage cell in which data of a logic low level is stored.

16. The electronic device of claim 15, wherein the read circuitry includes:
a current sensing unit to sense the data stored in the unit storage cell based on a read current flowing through the unit storage cell and a reference current flowing through the unit reference cell generated in response to the applied read voltage and reference voltage respectively.

17. The electronic device of claim 16, wherein the unit storage cell includes:
a variable resistance element whose resistance varies in response to the read current flowing through the variable resistance element.

18. The electronic device of claim 17, wherein the variable resistance element includes:
at least one of metal oxide, a phase change substance or a structure in which a tunneling barrier layer is interposed between two ferromagnetic layers.

* * * * *